(12) United States Patent
Opris

(10) Patent No.: US 6,759,898 B1
(45) Date of Patent: Jul. 6, 2004

(54) DUAL INPUT DIFFERENTIAL AMPLIFIER

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 10/351,150

(22) Filed: Jan. 24, 2003

(51) Int. Cl.[7] .............................. H03F 1/02; H03F 3/45
(52) U.S. Cl. .......................................... 330/9; 330/253
(58) Field of Search ..................... 330/9, 253

(56) References Cited

U.S. PATENT DOCUMENTS

| | | | | |
|---|---|---|---|---|
| 5,431,692 A | * | 7/1995 | Hansen et al. ................. | 607/28 |
| 5,546,026 A | * | 8/1996 | Lin et al. ....................... | 327/54 |
| 5,973,537 A | * | 10/1999 | Baschirotto et al. ........ | 327/337 |
| 6,563,348 B1 | * | 5/2003 | Beck et al. .................... | 327/94 |
| 2002/0089366 A1 | * | 7/2002 | Gupta | |

* cited by examiner

Primary Examiner—Patricia Nguyen
(74) Attorney, Agent, or Firm—Florin Alin Corie

(57) ABSTRACT

Embodiments of a dual input differential amplifier are described. The dual input differential amplifier includes multiple input devices forming at least two sets of differential inputs for an operational amplifier, and multiple switches within the operational amplifier, each switch being coupled to a corresponding input device to switch an active input set of the at least two sets in order to enable a reduction in residual charge associated with switching at an output of the corresponding switch.

27 Claims, 7 Drawing Sheets

DUAL INPUT DIFFERENTIAL AMPLIFIER

FIELD OF THE INVENTION

The present invention relates generally to electronic circuits and, more particularly, to dual input differential amplifiers.

BACKGROUND OF THE INVENTION

Current mixed mode signal processing techniques rely heavily on switched capacitor circuits because of the high levels of integration in metal-oxide semiconductor ("MOS") process technologies. As a result, in almost all available applications, reducing power dissipation becomes a key priority. Among the known techniques to reduce power dissipation, a widely used technique involves the reuse of the operational amplifiers ("opamps") in two complementary phases of the clock within two different stages.

For example, every stage in a pipeline A/D converter has a sample phase and a hold/amplify phase. In this case, the opamp is needed only in the hold/amplify phase. Therefore, two stages in the pipeline can share the same opamp.

FIG. 1 is a schematic diagram of a prior art circuit including a shared opamp 100. Referring to FIG. 1, if the opamp 100 is shared among two different stages, switching of the inputs and outputs between the two stages is required. However, since the opamp inputs are charge conservation nodes, any extraneous charge injected in those nodes during the opening of the switches in one stage corrupts the operation of the other stage, introducing stage-to-stage correlation and non-linearities in a pipeline analog/digital ("A/D") converter using this shared opamp technique. Therefore, in order to switch such opamp inputs, any residual charge at the switched nodes must be avoided or minimized.

Several techniques have been developed to reduce or eliminate the residual charge injection from switches or the residual charge due to incomplete stage settling or finite opamp open loop gain. However, these techniques require extra phases of the clock to perform a reset operation at the opamp inputs and, therefore, appear to cause an overall slowdown of the speed of the stage.

SUMMARY OF THE INVENTION

Embodiments for a dual input differential amplifier are described. The dual sets differential amplifier includes multiple input devices forming at least two sets of differential inputs for an operational amplifier, and multiple switches within the operational amplifier, each switch being coupled to a corresponding input device to switch an active input set of the at least two sets in order to enable a reduction in residual charge associated with switching at an output of the corresponding switch.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

According to embodiments described herein, a dual input differential amplifier is described. The dual input differential amplifier includes multiple input devices forming at least two sets of differential inputs for an operational amplifier, and multiple switches within the operational amplifier, each switch being coupled to a corresponding input device to switch an active input set of the at least two sets in order to enable a reduction in residual charge associated with switching at an output of the corresponding switch.

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 1:
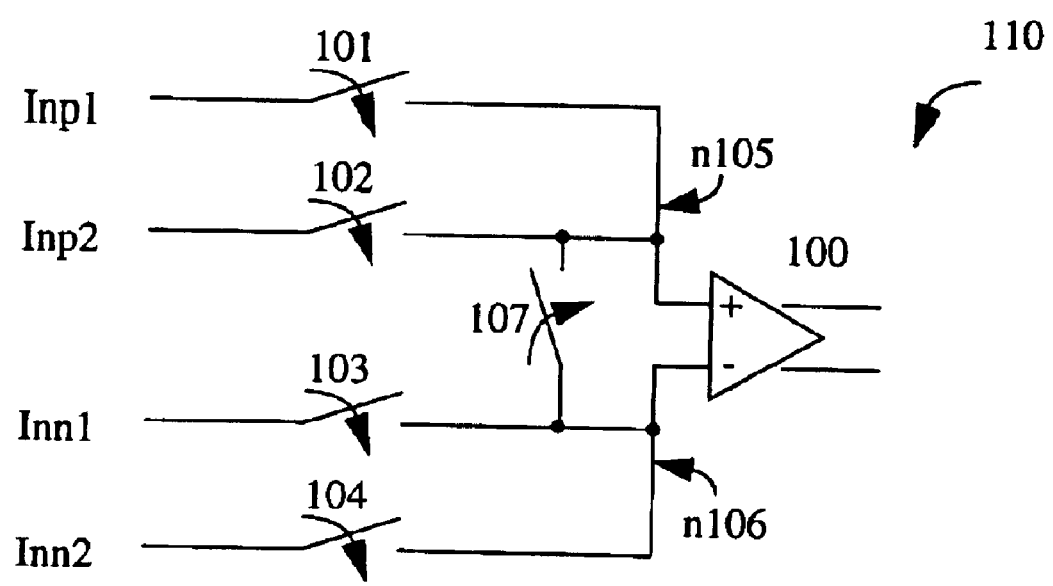
FIG. 1 is a schematic diagram of a prior art circuit including a shared opamp 100.

FIG. 1 is a schematic diagram of a prior art circuit 110 including an opamp 100 shared between two stages. As illustrated in FIG. 1, the circuit 110 includes an operational amplifier circuit ("opamp") 100, and multiple switches 101, 102 103, and 104. In one phase of the dock switches 101 and 103 are closed, switches 102 and 104 are open, and the opamp 100 is active in one stage. In the alternating phase of the clock, switches 102 and 104 are closed, switches 101 and 103 are open, and the opamp 100 is active in the second stage. As a result, a residual charge appears at the actual inputs of the opamp 100, specifically the nodes n105 and n106. In order to reduce the residual charge at the opamp inputs, a switch 107 is provided within the circuit 110, and an extra phase of the dock is used in the circuit 110, to short the opamp inputs together in order to eliminate or reduce the residual charge.

In one embodiment, the operational amplifier circuit 100 is similar to an operational amplifier disclosed in U.S. Pat. No. 5,847,607 to Lewicki et al. and assigned to National Semiconductor Corporation of Santa Clara, Calif., which is incorporated herein by reference.

Figure 2:
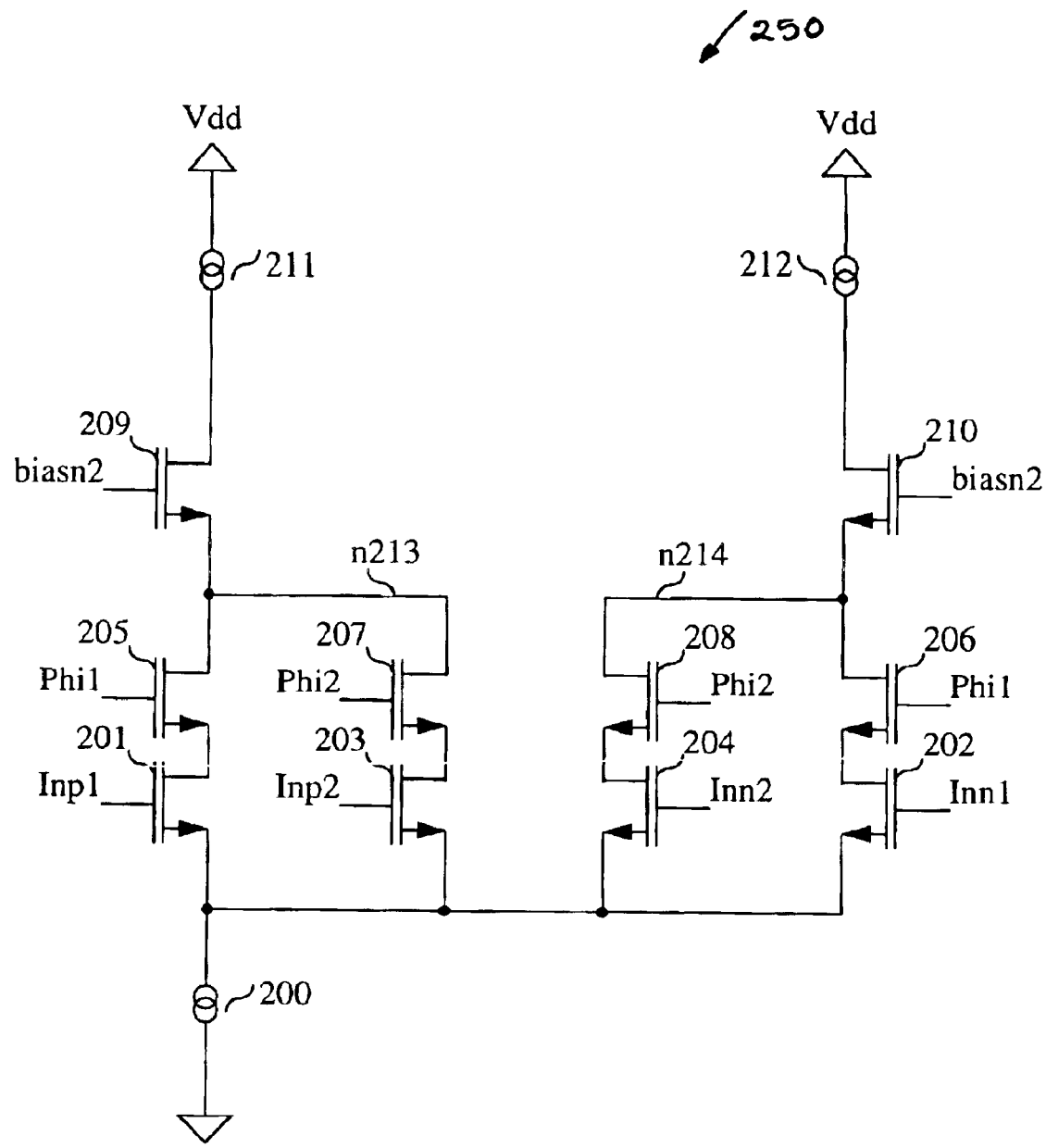
FIG. 2 is a schematic diagram of a dual input differential amplifier, according to one embodiment of the present invention.

FIG. 2 is a schematic diagram of a dual input differential amplifier, according to one embodiment of the present invention. As illustrated in FIG. 2, in one embodiment, dual input differential amplifier 250 includes multiple input devices, such as, for example transistor devices 201, 202, 203, and 204. The gates of the transistor devices 201, 202, 203, and 204 represent two sets of differential inputs of an operational amplifier ("opamp"), such as, for example, the opamp 100 shown in FIG. 1, the two sets of inputs being labeled Inp1, Inn1, Inp2 and Inn2, respectively. The sources of the transistor devices 201, 202, 203, and 204 are coupled to each other and to a current source 200.

In one embodiment, the drain of each transistor device 201, 202, 203, and 204 is coupled to a series switch within the opamp 100, such as, for example, to the source of transistor devices 205, 206, 207, and 208, respectively. The gates of the transistor devices 205, 206, 207, and 208 are Phi1 and Phi2 control signals used to control the active input pair during each phase of the clock. The drain of the transistor device 205 is coupled to the drain of the transistor device 207 at node n213 and the drain of the transistor device 206 is coupled to the drain of the transistor device 208 at node n214. Thus, the nodes n213 and n214 are outputs of the series switches 205, 207, and 206, 208, respectively.

In one embodiment, each set of inputs 201, 202, 203, and 204 is used in a separate stage and the corresponding series switches 205, 206, 207, and 208 are used to actually switch the active inputs from one stage to the other. As a result, there is no residual charge associated with the gain switching at the output nodes n213 and n214.

As illustrated in FIG. 2, the dual input differential amplifier 250 further includes MOS transistor devices 209 and 210, such as, for example, cascode devices having sources coupled to the respective nodes n213 and n214 to keep a low impedance at the nodes n213 and n214.

In one embodiment, when the inputs Inp1 and Inn1 are active, the signal Phi1 is active. When the signal Phi1 goes low and the signal Phi2 becomes active, the inputs Inp2 and Inn2 are activated. Since the input sets are separated, there is no charge injection sharing between them.

Figure 3:
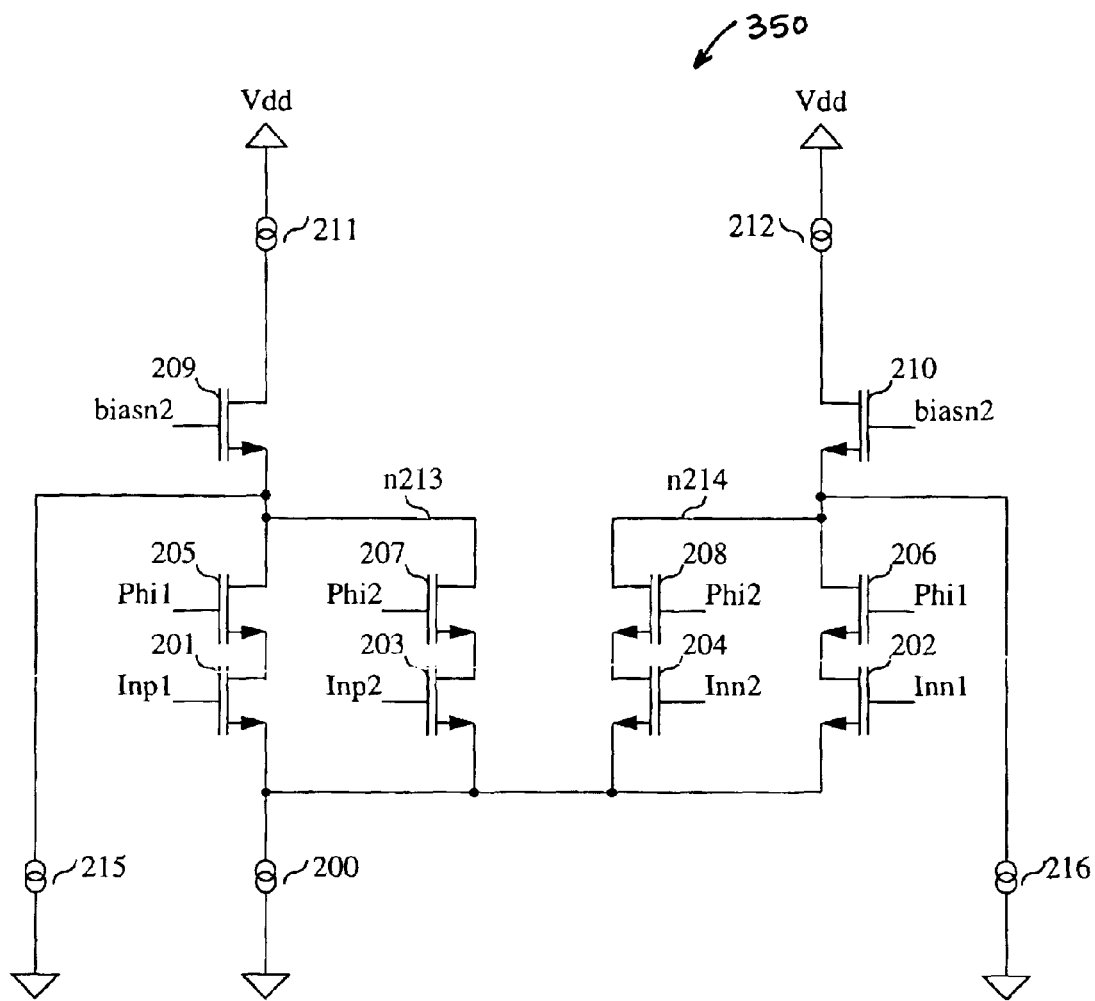
FIG. 3 is a schematic diagram or a dual input differential amplifier, according to an alternate embodiment of the present invention.

FIG. 3 is a schematic diagram of a dual input differential amplifier, according to an alternate embodiment of the present invention As illustrated in FIG. 3, in one alternate embodiment, dual input differential amplifier 350 includes the dual input differential amplifier 250 described in detail in connection with FIG. 2, and further includes additional current sources 215 and 216 coupled to the sources of the cascode transistor devices 209 and 210, respectively. The current sources 215 and 216 generate respective currents into the cascode nodes n213 and n214, which represent a small fraction of the main current generated by the current source 200. These currents generated by the current sources 215 and 216 are "bleed" currents to "keep alive" or bias the cascode transistor devices 209 and 210 and to prohibit them from cutting the currents completely during large input transients. In one embodiment, the Phi1 and Phi2 phases of the dock do not have to be non-overlapping. As described above, there is no residual charge associated with the gain switching at the output nodes n213 and n214.

Figure 4:
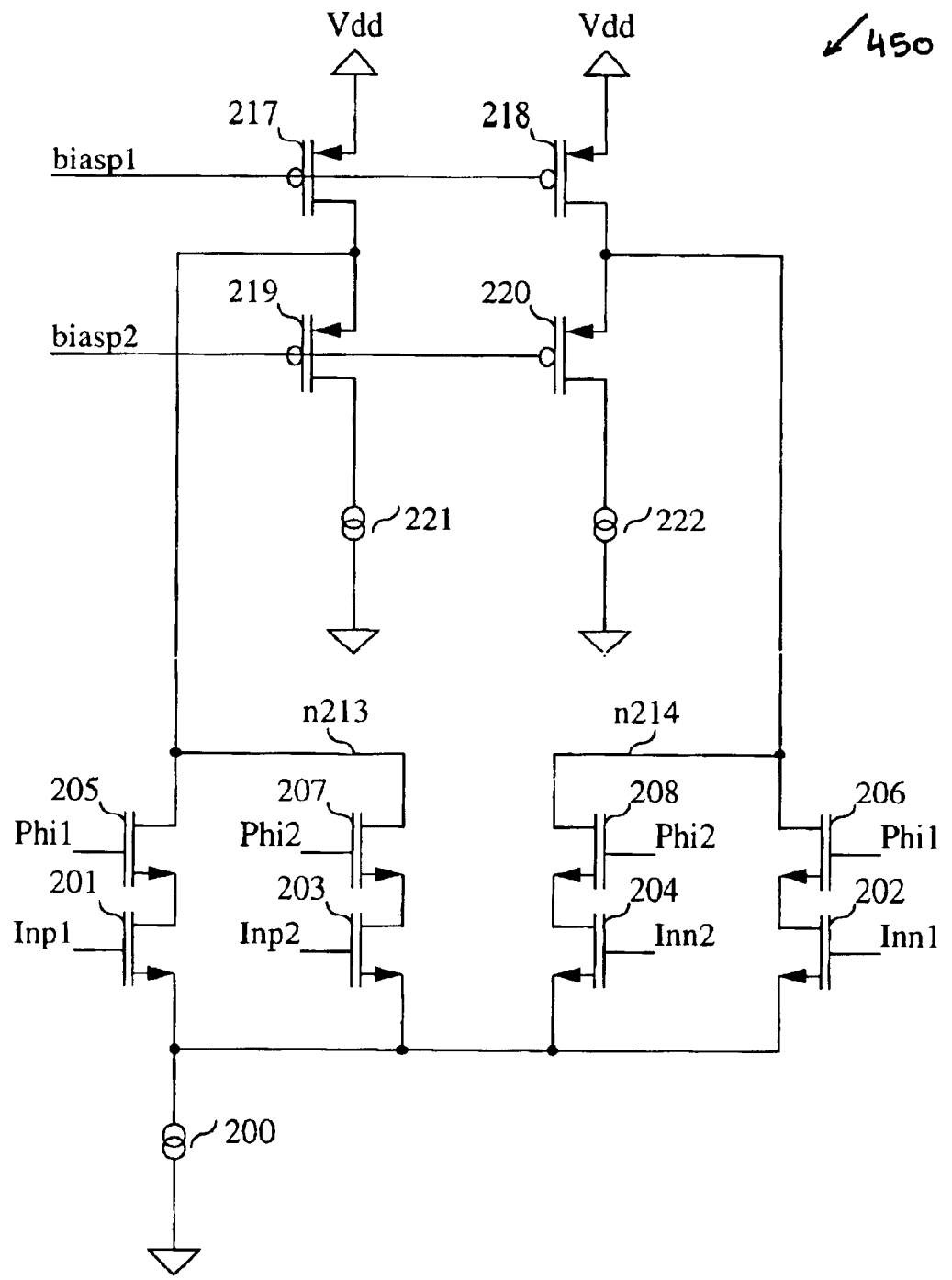
FIG. 4 is a schematic diagram of a dual input differential amplifier, according to another alternate embodiment of the present invention.

FIG. 4 is a schematic diagram of a dual input differential amplifier, according to another alternate embodiment of the present invention. Referring to FIG. 4, in one embodiment, dual input differential amplifier 450 is illustrated in a folded cascode configuration and includes the dual input differential amplifier 250 described in detail in connection with FIG. 2. The nodes n213 and n214 are inputs of cascode devices 217, 219, and 218, 220, respectively. The cascode devices 219 and 220 are of opposite polarity from the sets of transistor devices 201, 202, and 203,204, respectively. The cascode devices 217 and 218 serve as current sources for the folded cascode devices 219 and 220, respectively. Similar to the above-described embodiments, there is no residual charge associated with the gain switching at the output nodes n213 and n214.

Figure 5:
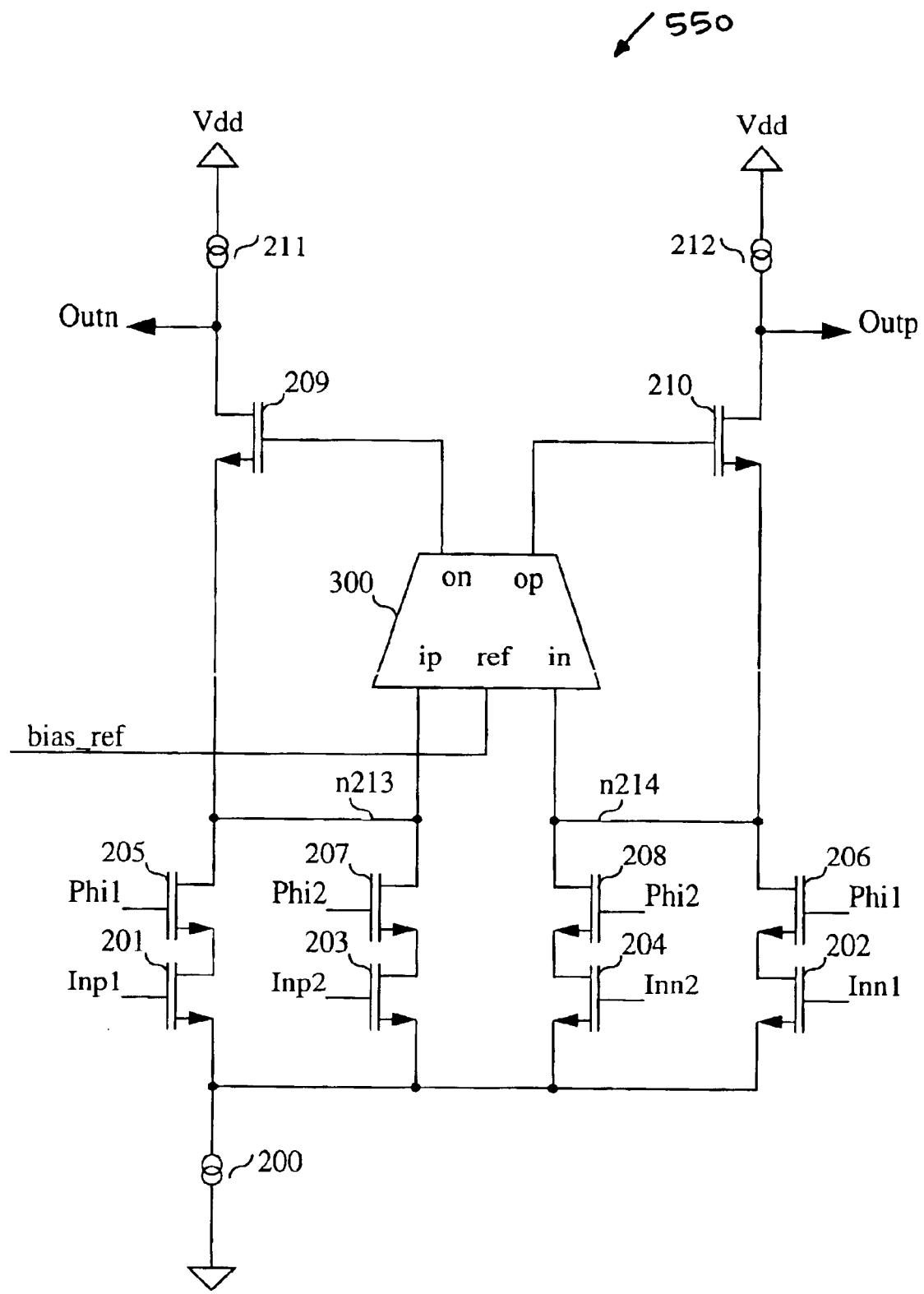
FIG. 5 is a schematic diagram of a dual input differential amplifier, according to another embodiment of the present invention.

FIG. 5 is a schematic diagram of a dual input differential amplifier, according to another embodiment of the present invention. As illustrated in FIG. 5, in one embodiment, dual input differential amplifier 550 includes the dual input differential amplifier 250 described in detail in connection with FIG. 2 and further includes a boost gain amplifier 300. In one embodiment, the boost gain amplifier 300 has three amplifier inputs "in", "ip", and "ref" and two amplifier outputs. Each amplifier output is fed into a respective cascode device 209 and 210.

The output of the switches 205 and 207 is coupled to the "ip" input of the amplifier 300. The output of the switches 206 and 208 is coupled to the "in" input of the amplifier 300. In one embodiment, a replica bias is introduced at the reference "ref" input of the amplifier 300 to set the reference level of the voltage and to control the voltage drop at the nodes n213 and n214. As a result, the input sets of the transistor devices 201, 202 and 203, 204 are at the edge of the saturation region, therefore maximizing the voltage swing at the output nodes Outp and Outn and boosting the gain.

Figure 6:
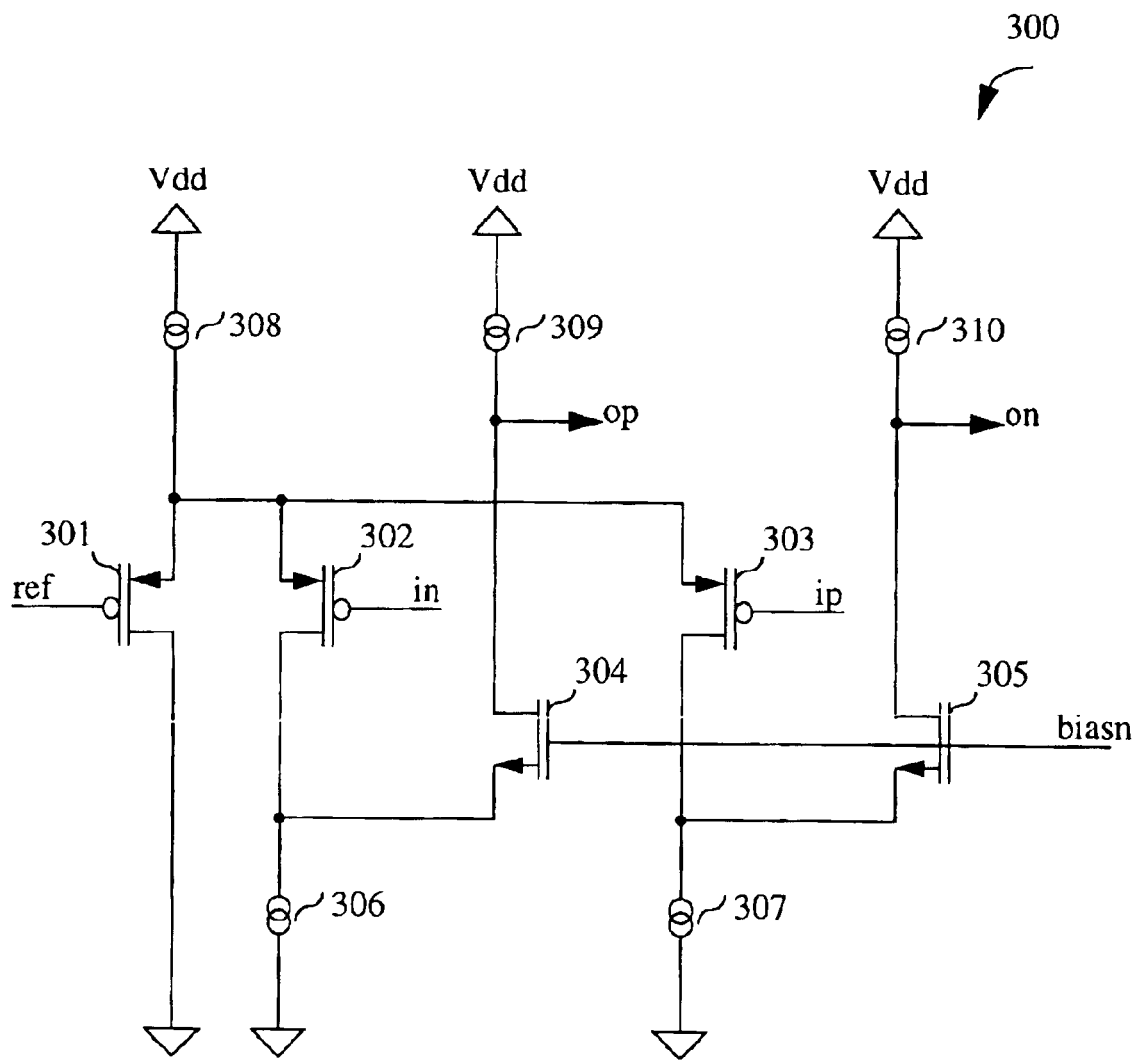
FIG. 6 is a schematic diagram of a 3-input gain boost amplifier within the dual input differential amplifier of FIG. 5, according to one embodiment of the present invention.

FIG. 6 is a schematic diagram of a 3-input gain boost amplifier within the dual input differential amplifier 550 of FIG. 5, according to one embodiment of the present invention. As illustrated in FIG. 6, in one embodiment, each input of the gain boost amplifier 300 is coupled to a gain boost amplifier input device 301, 302, and 303, respectively. The values of the current sources 306 through 310 are selected such as to force certain currents through the devices 301, 302, and 303. For example, in one embodiment, $I_{308}=3I$, $I_{306}=2I$, and $I_{309}=I_{310}=I$, and thus devices 301 through 303 are matched. Alternatively, $I_{308}=4I$, $I_{306}=I_{307}=2I$, and $I_{309}=I_{310}=I$, and thus devices 302 and 303 are half the size of device 301.

In an alternate embodiment, the current sources 308 and 309 may be cascoded in order to increase the gain of the gain boost amplifier 300. In another alternate embodiment, all the current sources 306 through 310 may be cascoded in order to improve the output conductance and the gain.

Figure 7:
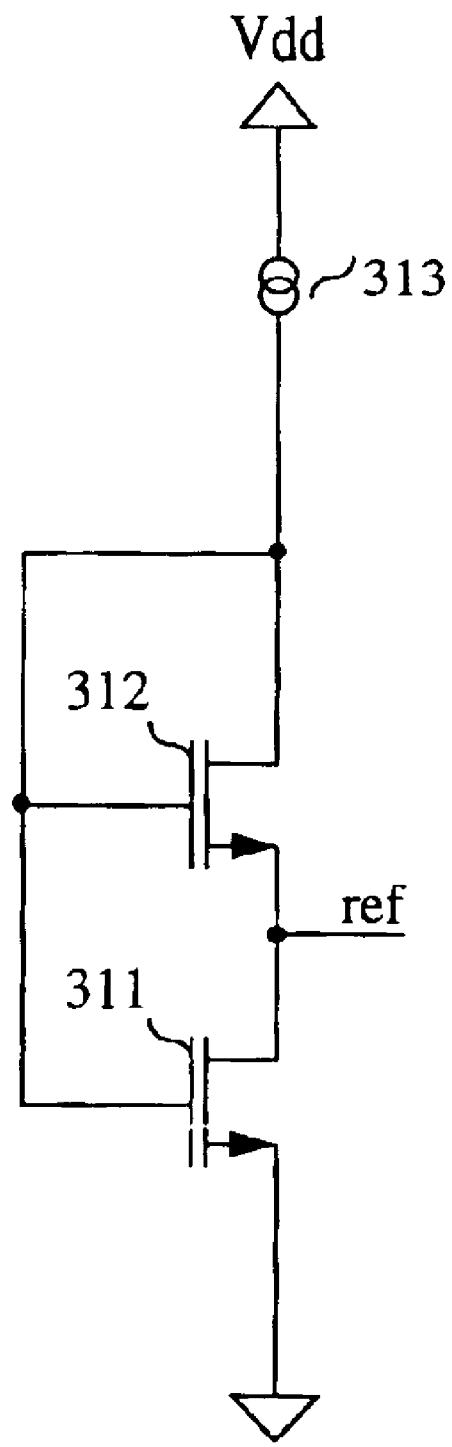
FIG. 7 illustrates one embodiment of a circuit to obtain a reference level input to be used with the dual input differential amplifier of FIG. 5.

FIG. 7 illustrates one embodiment of a circuit to obtain a reference level input to be used with the dual input differential amplifier 550 of FIG. 5. As illustrated in FIG. 7, in one embodiment, a device 311 is in the linear region with a drain-source voltage drop Vds equal to the saturation voltage of the input transistor devices 201 through 204 shown in FIG. 5 added to the saturation voltage of the current source 200 shown in FIG. 5 further added to a predetermined desired design margin.

It is to be understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical acoustical or other form of propagated signals( e.g., carrier waves, infrared signals, digital signals, etc.); etc.

In the foregoing specification, the invention has been described with reference to specific exemplary embodiments thereof. It will however, be evident that various modifications and changes may be made thereto without departing from the broader spirit and scope of the invention as set forth in the appended claims. The specification and drawings are, accordingly, to be regarding in an illustrative sense rather than a restrictive sense.

What is claimed is:

1. A circuit comprising:
a plurality of input devices forming at least two sets of differential inputs for an operational amplifier; and
a plurality of switches within said operational amplifier, each switch of said plurality of switches being coupled to a corresponding input device of said plurality of input devices to switch an active input set of said at least two sets in order to enable a reduction in residual charge associated with switching at an output of said each corresponding switch.

2. The circuit according to claim 1, wherein each input device is an input transistor device having a gate representing a differential input of said at least two sets of differential inputs.

3. The circuit according to claim 2, wherein said each switch is a switch transistor device having a gate representing a control signal used to control said active input set of said at least two sets during each phase of a clock.

4. The circuit according to claim 3, wherein sources of said each input transistor device are coupled to each other and to a current source.

5. The circuit according to claim 3, wherein a source of said each switch transistor device is coupled to a drain of said corresponding input transistor device.

6. The circuit according to claim 1, further comprising a plurality of cascode transistor devices having sources coupled to respective outputs of said each corresponding switch in order to keep a low impedance at said respective outputs.

7. The circuit according to claim 6, further comprising a plurality of current sources, each current source being coupled to a source of a corresponding cascode transistor device of said plurality of cascode transistor devices in order to generate a respective current, which enables biasing of said corresponding cascode transistor device and prohibits said cascode transistor device from cutting currents completely during large input transients.

8. The circuit according to claim 1, further comprising a plurality of cascode transistor devices, said output of said each switch being coupled to a respective first cascode transistor device having opposite polarity from said corresponding input device and to a second cascode transistor device serving as current source to said respective first cascode transistor device.

9. The circuit according to claim 6, further comprising a boost gain amplifier having a plurality of amplifier inputs to control a voltage level at said output of said each corresponding switch and a plurality of amplifier outputs, each amplifier output being coupled to a cascode transistor device of said plurality of cascode transistor devices, and at least one amplifier input being coupled to said output of said each corresponding switch.

10. The circuit according to claim 9, wherein a reference input of said plurality of inputs introduces a replica bias to set a reference voltage level at said output of said each corresponding switch.

11. An apparatus comprising:
means for forming at least two sets of differential inputs for an operational amplifier; and
means for switching an active input set of said at least two sets of differential inputs in order to enable a reduction in residual charge associated with switching at an output of said operational amplifier.

12. A machine-readable medium storing a description of a circuit, said circuit comprising:
a plurality of input devices forming at least two sets of differential inputs for an operational amplifier; and
a plurality of switches within said operational amplifier, each switch of said plurality of switches being coupled to a corresponding input device of said plurality of input devices to switch an active input set of said at least two sets in order to enable a reduction in residual charge associated with switching at an output of said each corresponding switch.

13. The machine-readable medium according to claim 12, wherein said circuit further comprises a plurality of cascode transistor devices having sources coupled to respective outputs of said each corresponding switch in order to keep a low impedance at said respective outputs.

14. The machine-readable medium according to claim 13, wherein said circuit further comprises a plurality of current sources, each current source being coupled to a source of a corresponding cascode transistor device of said plurality of cascode transistor devices in order to generate a respective current, which enables biasing of said corresponding cascode transistor device and prohibits said cascode transistor device from cutting currents completely during large input transients.

15. The machine-readable medium according to claim 12, wherein said circuit further comprises a plurality of cascode transistor devices, said output of said each switch being coupled to a respective first cascode transistor device having opposite polarity from said corresponding input device and to a second cascode transistor device serving as current source to said respective first cascode transistor device.

16. The machine-readable medium according to claim 13, wherein said circuit further comprises a boost gain amplifier having a plurality of amplifier inputs to control a voltage level at said output of said each corresponding switch and a plurality of amplifier outputs, each amplifier output being coupled to a cascode transistor device of said plurality of cascode transistor devices, and at least one amplifier input being coupled to said output of said each corresponding switch.

17. The machine-readable medium according to claim 16, wherein a reference input of said plurality of inputs introduces a replica bias to set a reference voltage level at said output of said each corresponding switch.

18. The machine-readable medium according to claim 12, wherein said description comprises a behavioral level description of said circuit.

19. The machine-readable medium according to claim 18, wherein said behavioral level description is compatible with a VHDL format.

20. The machine-readable medium according to claim 18, wherein said behavioral level description is compatible with a Verilog format.

21. The machine-readable medium according to claim 12, wherein said description comprises a register transfer level netlist.

22. The machine-readable medium according to claim 12, wherein said description comprises a transistor level netlist.

23. A method to manufacture a circuit comprising:

coupling a plurality of input devices forming at least two sets of differential inputs for an operational amplifier to a plurality of switches within said operational amplifier, each switch of said plurality of switches being coupled to a corresponding input device of said plurality of input devices to switch an active input set of said at least two sets in order to enable a reduction in residual charge associated with switching at an output of said each corresponding switch.

24. The method according to claim 23, further comprising:

coupling a source of each cascode transistor device of a plurality of cascode transistor devices to respective outputs of said each corresponding switch in order to keep a low impedance at said respective outputs.

25. The method according to claim 24, further comprising:

coupling a current source to said source of said each cascode transistor device in order to generate a respective current, which enables biasing of said corresponding cascode transistor device and prohibits said cascade transistor device from cutting currents completely during large input transients.

26. The method according to claim 23, further comprising:

coupling said output of said each switch to a respective first cascode transistor device having opposite polarity from said corresponding input device and to a second cascode transistor device serving as current source to said respective first cascode transistor device.

27. The method according to claim 23, further comprising:

coupling each amplifier output of a boost gain amplifier to a cascode transistor device of said plurality of cascode transistor devices, said boost gain amplifier having a plurality of amplifier inputs to control a voltage level at said output of said each corresponding switch and a plurality of amplifier outputs; and coupling at least one amplifier input of said plurality of amplifier inputs to said output of said each corresponding switch.

* * * * *